(12) United States Patent
Ueda

(10) Patent No.: US 6,191,844 B1
(45) Date of Patent: *Feb. 20, 2001

(54) SCANNING EXPOSURE APPARATUS IN WHICH LIGHT EXPOSURE IS A FUNCTION OF THE SPEED OF THE MASK OR SUBSTRATE STAGE

(75) Inventor: Toshio Ueda, Ohsato-gun (JP)

(73) Assignee: Nikon Corporation, Tokyo (JP)

( * ) Notice: Under 35 U.S.C. 154(b), the term of this patent shall be extended for 0 days.

This patent is subject to a terminal disclaimer.

(21) Appl. No.: 09/362,686

(22) Filed: Jul. 29, 1999

Related U.S. Application Data

(62) Division of application No. 08/715,641, filed on Sep. 18, 1996, now Pat. No. 5,995,203.

(30) Foreign Application Priority Data

Oct. 19, 1995 (JP) .................................................. 7-296235

(51) Int. Cl.⁷ ........................... G03B 27/42; G03B 27/54; G03B 27/72
(52) U.S. Cl. .................... 355/67; 355/53; 355/69
(58) Field of Search .................. 355/67, 53, 69, 355/55, 77, 71, 68, 70; 356/399, 400, 401; 250/201.1, 548, 559, 593.3

(56) References Cited

U.S. PATENT DOCUMENTS

| | | | |
|---|---|---|---|
| 4,057,347 | 11/1977 | Moriyama et al. | 355/67 |
| 5,489,986 | 2/1996 | Magome et al. | 356/401 |
| 5,491,534 | 2/1996 | Shiozawa | 355/69 |
| 5,526,093 | 6/1996 | Takahashi | 355/53 |
| 5,567,928 | 10/1996 | Sano | 250/205 |
| 5,581,075 | 12/1996 | Naraki et al. | 250/205 |
| 5,591,958 | 1/1997 | Nishi et al. | 250/205 |
| 5,627,627 | 5/1997 | Suzuki | 355/68 |
| 5,995,203 | * 11/1999 | Ueda | 355/67 |

FOREIGN PATENT DOCUMENTS 7-135158  5/1995  (JP) .

* cited by examiner

Primary Examiner—Eddie C. Lee
Assistant Examiner—Rodney Fuller
(74) Attorney, Agent, or Firm—Oliff & Berridge, PLC

(57) ABSTRACT

When the scanning of a mask stage and a substrate stage is started, an interferometer measures the position of the substrate stage, while an interferometer unit differentiates the output of the interferometer to give a speed signal on the substrate stage, and delivers this speed signal. A main control unit produces a target value for the amount of exposure light adapted to this speed signal. A light amount adjustment system adjusts the amount of exposure light from an exposure light source in response to the target value calculated by the main control unit. Thus, exposure with appropriate amount of light adapted to the speed of the substrate stage is performed over all of the time zones from the start of drive of the substrate stage in the scan direction until its standstill. Hence, the exposure time can be shortened, and the throughput can be increased, in comparison with exposure being performed only in the constant speed zone of the stage.

20 Claims, 3 Drawing Sheets

SCANNING EXPOSURE APPARATUS IN WHICH LIGHT EXPOSURE IS A FUNCTION OF THE SPEED OF THE MASK OR SUBSTRATE STAGE

This is a Division of application Ser. No. 08/715,641 filed Sep. 18, 1996 now U.S. Pat. No. 5,995,203. The entire disclosure of the prior application is hereby incorporated by reference herein in its entirety.

BACKGROUND OF THE INVENTION

1. Field of the Invention

The present invention relates to a scanning projection exposure apparatus, and more particularly, to a scanning projection exposure apparatus for transferring the pattern of a mask onto a photosensitive substrate via a projection optical system while synchronously moving a mask stage for holding the mask, and a substrate stage for holding the photosensitive substrate in a predetermined scan direction.

2. Description of the Related Art

A scanning projection exposure apparatus has been known as one of exposure apparatuses for use in producing semiconductor devices or liquid crystal display devices by the photolithographic process. The scanning projection exposure apparatus, if briefly described, transfers the pattern of a reticle, as a mask, onto a photosensitive substrate via a projection optical system while synchronously scanning a reticle stage (mask stage) for holding the reticle and a substrate stage for holding the photosensitive substrate in a predetermined scan direction.

In a conventional scanning projection exposure apparatus, the reticle stage and the substrate stage were controlled by stage speed control systems assigned respective target values so that the reticle stage and the substrate stage would be synchronously scanned at a speed ratio (e.g., 4:1) determined by the projection magnification ratio of a projection optical system. FIG. 3 shows an example of the speed versus time profile of the substrate stage during scan exposure. As shown in this drawing, the substrate stage is accelerated and reaches a target speed (0.08 m/s, herein). Then, when a predetermined stabilization time (the period of time required for the substrate stage to be synchronized with the reticle stage) has elapsed, an exposure light source is turned on for a predetermined period of time (scan exposure time) to illuminate the reticle with a constant amount of exposure light for performing exposure. After exposure is completed, a predetermined idle time is provided before the stage is decelerated from the target speed to a standstill. The target speed of the stage is determined by the sensitivity of a resist coated onto the surface of the photosensitive substrate so as to give the necessary amount of exposure. That is, the amount of exposure has been determined by the power of the exposure light source (a constant value) multiplied by the speed of the stage (a constant speed).

With this background, development of a high speed stage system is under way to shorten the exposure time and increase the throughput.

To realize such a high speed stage system, the capacity of a power amplifier should be increased to obtain a greater thrust. However, this leads to cost buildup. A laser interferometer, usually used to measure the position of the stage, should be increased in measurement accuracy with the speeding of the stage. As the moving speed of the stage rises, vibrations of the apparatus become large, adversely affecting imaging characteristics. Thus, it is not an easy task to improve the throughput by speeding up the stage.

SUMMARY OF THE INVENTION

The present invention has been accomplished under these circumstances. Its object is to provide a scanning projection exposure apparatus capable of shortening the exposure time without making the speed of the stage high.

To attain this object, this invention has been designed to perform an exposure action not only in a constant speed zone of the stage, but also in an acceleration zone until the stage reaches its target speed, and a deceleration zone ranging from the end of the target speed to a standstill, while controlling the amount of light for exposure in an appropriate manner.

According to a first aspect of the invention, there is provided a scanning projection exposure apparatus comprising:

an exposure light source for emitting exposure light to illuminate a mask;

a mask stage for scanning the mask across an illumination region on the mask;

a projection optical system for projecting images of a pattern of the mask onto a photosensitive substrate;

a substrate stage for scanning the photosensitive substrate across an exposure region which is conjugate to the illumination region with respect to the projection optical system;

a position measuring device for measuring the position of one of the mask stage and the substrate stage;

a calculation part for calculating a target value for the amount of exposure light depending on the speed of the one stage on the basis of an output from the position measuring device; and a light amount adjustment system for adjusting the amount of exposure light from the exposure light source in response to the target value from the calculation part.

In accordance with the scanning projection exposure apparatus of the present invention, when the scanning of the stage is started, the calculation part calculates the speed of one (e.g., the substrate stage) of the mask stage and the substrate stage on the basis of an output from the position measuring device (e.g., laser interferometer) which measures the position of the one stage (e.g., the substrate stage). At the calculation part, a target value for the amount of exposure light adapted to the stage speed is calculated so that exposure may be performed with the same amount of light over any of the acceleration period, constant speed period, and deceleration period of the stage. The light amount adjustment system adjusts the amount of exposure light from the exposure light source in response to the target value from the calculation part. Thus, exposure is carried out throughout the period from the start of drive to the halt, including the constant speed zone in the scan direction of the substrate stage, whereby exposure takes place with uniform amount of light all over those areas on the photosensitive substrate which are subjected to exposure (shot areas). Hence, the scan time is shortened, and the throughput for the production of a semiconductor device is increased.

In the scanning projection exposure apparatus of the present invention, the light amount adjustment system is preferably a closed loop control system including a light amount detector for detecting the amount of exposure light, and a controller for acting based on a light amount deviation, as an action signal, which is the difference between the output of the light amount detector and the target value of the amount of exposure light. According to this construction, the controller makes follow-up control so that the output of the light amount detector coincides with the target value. Even if the light amount adjustment system undergoes any disturbance, therefore, little influence is exerted, and exposure with appropriate amount of light takes place, regardless of the speed of the substrate stage, throughout the entire time zone from the start of drive in the scan direction of the substrate stage until its standstill.

In the present invention, the exposure light source may be an excimer laser light source which emits pulsed light. The amount of exposure light can be adjusted by modulating the number of laser pulses in response to the target value of the amount of exposure light. The excimer laser makes it easy to modulate the amount of exposure light.

According to a second aspect of the present invention, an exposure method for exposing a pattern of a mask to lead the pattern onto a photosensitive substrate, comprising:

scanning the mask across an illumination region on the mask while illuminating the mask with exposure light;

scanning the photosensitive substrate across an exposure region on the photosensitive substrate in synchronism with the scanning of the mask, the exposure region being optically conjugate to the illumination region; and modulating the amount of exposure light in response to the moving speed of the mask or the photosensitive substrate so that the photosensitive substrate may be exposed with a uniform amount of light from the start of the scanning until completion of the scanning.

In accordance with the exposure method of the present invention, the amount of exposure light is adjusted in response to the moving speed of the mask or the photosensitive substrate during scan exposure. Thus, scanning exposure can be performed not only during the period for which the stage for moving the mask or the photosensitive substrate moves at a constant speed, but also during the period for which this stage is accelerated or decelerated. Hence, the exposure time can be shortened, and the throughput for the production of a semiconductor device can be increased.

For the exposure method of the invention, it is preferred to measure the position of the mask or the photosensitive substrate, determine the speed of the mask or the photosensitive substrate at the measured position of the mask or the photosensitive substrate, calculate the target value for the amount of exposure light adapted to the determined speed, and modulate the amount of exposure light so as to coincide with the calculated target value. For this purpose, the target value of the amount of exposure light can be calculated, with the speed of the mask or the photosensitive substrate at the measured position of each stage as a proportional constant. A pulsed laser, such as an excimer laser, may be used as a source of exposure light, and the amount of light may be modulated by modulating the pulse frequency of the laser. Alternatively, continuous light from a mercury lamp or a CW laser may be used as exposure light, and the amount of light can be modulated by modulating the power or cutting frequency of the laser.

DETAILED DESCRIPTION OF THE PREFERRED EMBODIMENTS

An embodiment of the present invention will now be described with reference to FIG. 1 and FIG. 2.

Figure 1:
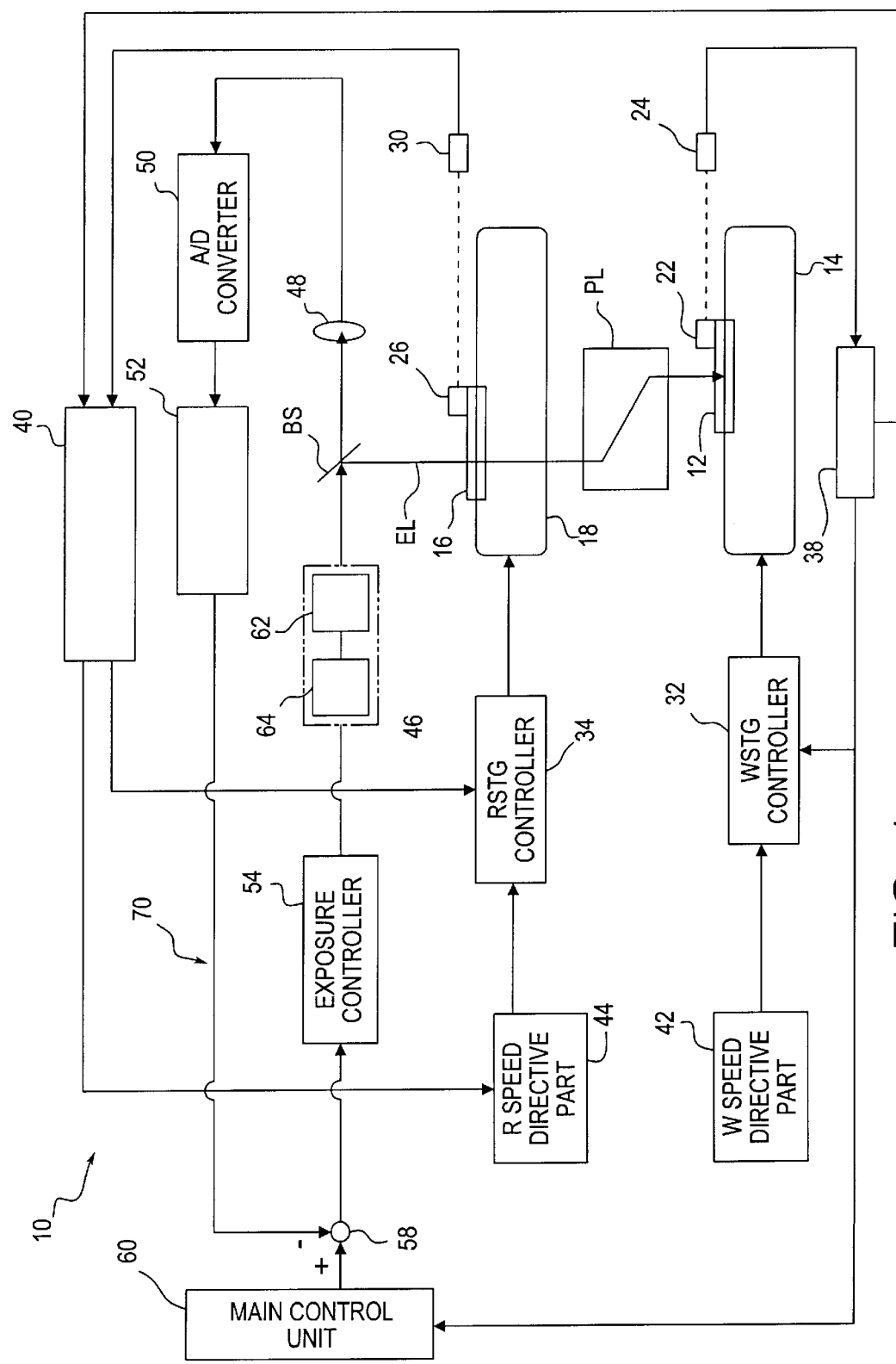
FIG. 1 is a composite illustration of a scanning projection exposure apparatus concerned with an embodiment.

FIG. 1 illustrates a scanning projection exposure apparatus 10 related to an embodiment, which is mainly composed of a stage drive control system and an exposure energy control system 70 as a light amount adjustment system. The scanning projection exposure apparatus 10 has a wafer stage 12 as a substrate stage, and a reticle stage 16 as a mask stage. The wafer stage 12 is provided on a wafer support (not shown) so as to be movable in the direction of scanning (the right-and-left direction in FIG. 1) and in a direction perpendicular to the scan direction (the direction perpendicular to the sheet face in FIG. 1). The wafer stage 12 is adapted to be driven in the scan direction by a wafer linear motor 14, and be driven in the direction perpendicular to the scan direction by a feed screw mechanism (not shown). Since the movement of the stage 12 in the direction perpendicular to the scan direction is minimally related to the present invention, the explanation on this direction will be omitted in the present description. The wafer support is actually provided on a, vibration damping base (not shown).

The reticle stage 16 is provided on a reticle support (not shown) so as to be movable in the direction of scanning (the right-and-left direction in FIG. 1). This reticle stage 16 is adapted to be driven in the scan direction by a reticle linear motor 18. The reticle support is actually placed on a body column (not shown) on the vibration damping base. A reticle (not shown) held on the reticle stage 16 is illuminated with a uniform optical flux of a slit-like cross section from an illumination body portion 46 to form an illumination region in the shape of a slit on the reticle. During scan exposure, the reticle stage 16 moves across this illumination region to scan the reticle.

Above the wafer stage 12, a projection optical system PL is disposed with its optical axis heading in a direction perpendicular to the moving plane of the wafer stage 12, and is held on the body column (not shown). A wafer (not shown) as a photosensitive substrate is placed on the wafer stage 12, and a reticle (not shown) as a mask is placed on the reticle stage 16. The pattern surface of the reticle and the wafer surface are positioned to be conjugate to each other with respect to the projection optical system PL. In the instant embodiment, the projection optical system PL has a projection magnification of one fourth. The wafer is illuminated with exposure light that has passed the projection optical system PL, to form a slit-shaped exposure region. This exposure region is conjugate to the illumination region, formed on the reticle, with respect to the projection optical system PL. The photosensitive substrate is scanned by moving the substrate stage in the scan direction across the exposure region in synchronism with the reticle stage 16.

At one end (the right end in FIG. 1) of the wafer stage 12 in the scan direction, a movable mirror 22 for a wafer laser interferometer is provided to extend in the direction perpendicular to scanning. Opposed to the movable mirror 22 is a wafer laser interferometer 24. The wafer laser interferometer 24 emits laser light toward the movable mirror 22, and also receives light reflected by the movable mirror 22 to detect the position of the wafer stage 12.

Likewise, at one end (the right end in FIG. 1) of the reticle stage 16 in the scan direction, a movable mirror 26 for a reticle laser interferometer is provided to extend in the direction perpendicular to scanning. Opposed to the movable mirror 26 is a reticle laser interferometer 30. The reticle laser interferometer 30 emits laser light toward the movable mirror 26, and also receives light reflected by the movable mirror 26 to detect the position of the reticle stage 16.

The stage drive control system comprises the wafer laser interferometer 24, the reticle laser interferometer 30, a wafer stage controller ("WSTG controller") 32 for controlling the speed of the wafer stage 12 via the wafer linear motor 14, a reticle stage controller ("RSTG controller") 34 for controlling the speed of the reticle stage 16 via the reticle linear motor 18, a wafer laser interferometer unit 38, a reticle laser interferometer unit 40, a wafer stage speed directive part ("W speed directive part") 42, and a reticle stage speed directive part ("R speed directive part") 44.

The wafer laser interferometer unit 38 receives a position detection signal on the wafer stage 12 from the wafer laser interferometer 24, multiplies this position detection signal by the reciprocal (4 in this case) of the magnification of the projection optical system PL to obtain a position signal, sends this position signal to the reticle laser interferometer unit 40. The wafer laser interferometer unit 38 also differentiates the position detection signal to obtain a speed signal on the wafer stage, and delivers this speed signal to the WSTG controller 32, and a main control unit 60 to be described later.

The reticle laser interferometer unit 40 receives a position detection signal on the reticle stage 16 from the reticle laser interferometer 30, and the position signal from the wafer laser interferometer unit 38. Then, the reticle laser interferometer unit 40 calculates the difference between the position detection signal and the position signal to give a position error signal, and sends this position error signal to the reticle stage speed directive part ("R speed directive part") 44. The interferometer unit 40 also functions to differentiate the position detection signal on the reticle stage 16 to obtain a speed signal on the reticle stage 16, and sends this speed signal to the RSTG controller 34.

The W speed directive part 42 enters the target value for the speed of the wafer stage 12 into the WSTG controller 32. The R speed directive part 44 takes in the position error signal from the reticle laser interferometer unit 40, and issues a target value for the speed of the reticle stage 16 which will cancel the position error involved.

The WSTG controller 32 is a controller for doing a control action so as to eliminate the deviation of the speed signal on the wafer stage from the wafer laser interferometer unit 38 from the target value of the speed from the W speed directive part 42. The RSTG controller 34 is a controller for doing a control action so as to eliminate the deviation of the speed signal on the reticle stage 16 from the reticle laser interferometer unit 40 from the target value of the speed from the R speed directive part 44. PI controllers, for example, are used as these controllers 32, 34. During scan exposure, the speed of the wafer stage 12 is controlled by the WSTG controller 32 in response to the target value of speed from the W speed directive part 42, while the speed of the reticle stage 16 is controlled by the RSTG controller 34 in response to the target value of speed from the R speed directive part 44, so that the wafer stage 12 and the reticle stage 16 will be scanned at a speed ratio which is the reciprocal of the magnification of the projection optical system PL. If, at this time, a position error occurs between the stages 12 and 16, the target value of speed which will cancel this position error is issued to the RSTG controller 34 from the R speed directive part 44, whereby the two stages are synchronously scanned.

Next, the exposure energy control system 70 will be described. The exposure energy control system 70 includes a power monitor 48 as a light amount detector for receiving light transmitted through a beam splitter BS for exposing illumination light EL from an illumination part body 46 and detecting the amount of this transmitted light; an A/D converter 50 for digitally converting the output of the power monitor 48; a voltage-exposure energy conversion part 52 for converting the voltage from the A/D converter 50 into exposure energy; a subtracter 58 for calculating an energy deviation (light amount deviation), the difference between the target value of the exposure energy (amount of exposure light) from the main control unit 60 and the detected value of the exposure energy given as a feedback from the voltage-exposure energy conversion part 52; and an exposure controller 54 as a controller comprising a PI or PID controller (adjuster) which acts based on this energy deviation as an action signal. The illumination light EL reflected by the beam splitter BS is projected on the reticle, and a pattern on the reticle illuminated by this exposure light EL is to be exposed onto the wafer via the projection optical system PL.

The illumination part body 46 is composed of an excimer laser light source 62 as an exposure light source, and a light source control part 64 for controlling the number of pulses of pulsed light, emitted by the excimer laser light source 62, in accordance with a directive (target value) from the exposure controller 54.

The main control unit 60 is composed of a so-called microcomputer or minicomputer. This unit 60 receives the speed signal on the wafer stage 12 from the wafer laser interferometer unit 38, calculates exposure energy depending on the speed of the wafer stage 12 in a manner to be described later, and outputs the subtracter 58 the calculated exposure energy as the target value. That is, according to this embodiment, the main control unit 60 constitutes the calculation part for the target value of the exposure amount.

The method of calculation by the main control unit 60 of the exposure energy depending on the speed of the wafer stage 12 will now be described in detail. First, the principle of calculation of the exposure energy is explained using time functions to facilitate mathematical understanding.

Figure 2A:
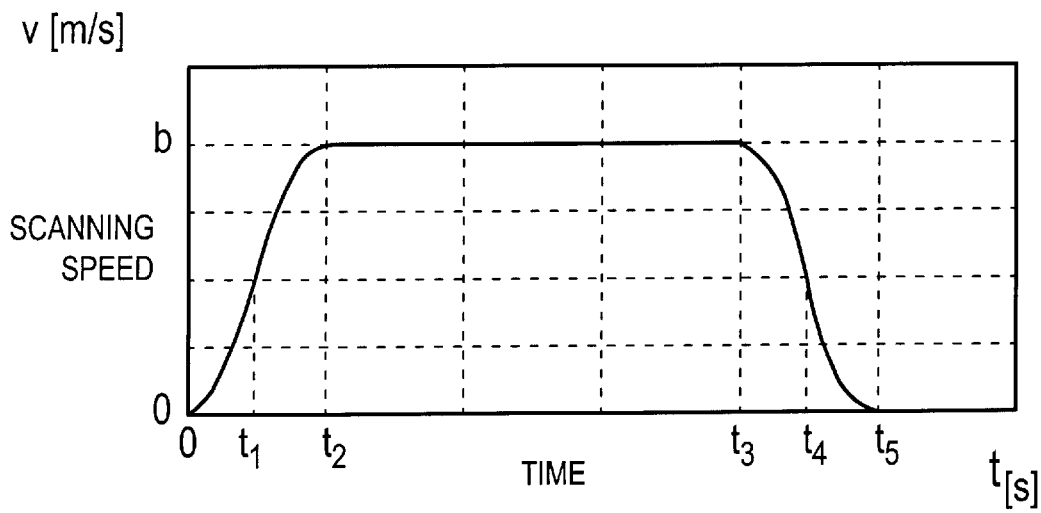
FIG. 2A is a chart showing an example of the time course of the speed of the wafer stage during its scanning action.
Figure 2B:
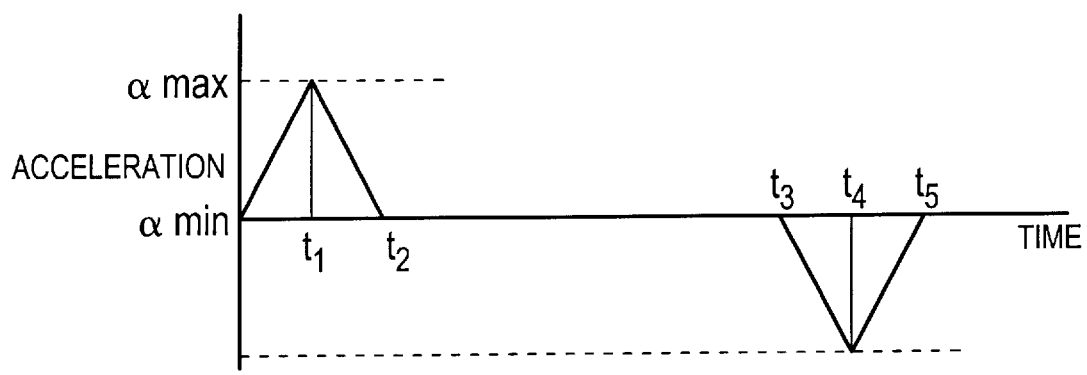
FIG. 2B is a chart showing the time course of acceleration corresponding to FIGS. 2A and 2B.

If the speed of the wafer stage 12 is controlled as shown in FIG. 2A, for example, its acceleration varies as shown in FIG. 2B.

In the chart of the time course of the acceleration shown in FIG. 2B, if the slope $\alpha$ max/$t_1$=a, then the acceleration $\alpha(t)$, the speed v(t), and the position p(t) in the range $0 \leq t \leq t_1$ are:

$$\alpha(t) = at \tag{1a}$$

$$v(t) = at^2/2 \tag{1b}$$

$$p(t) = at^3/6 \tag{1c}$$

Also, $\alpha$ max/$(t_1-t_2)$=$-a$, and $t_2=2t_1$, then the acceleration $\alpha(t)$, the speed v(t), and the position p(t) in the range $t_1 \leq t \leq t_2$ are:

$$\alpha(t) = -at + at1 \tag{2a}$$

$$v(t) = -(at^2/2) + at_1 t + (at_1^2/2) \tag{2b}$$

$$p(t) = -(at^3/6) + (at_1 t^2/2) + (at_1^2 t/2) \tag{2c}$$

In the constant speed zone $t_2 \leq t \leq t_3$, the acceleration $\alpha(t)$, the speed v(t), and the position p(t) are given by:

$$\alpha(t) = 0 \tag{3a}$$

$$v(t) = v(t_2) = b = \text{constant} \tag{3b}$$

$$p(t)=bt \tag{3c}$$

where b denotes the speed of the wafer stage at time $t_2$, namely, the target speed of the wafer stage.

If the absolute values of α max and α min are identical, and $t_2=t_5-t_3=2(t_4-t_3)$, then the acceleration α(t), the speed v(t), and the position p(t) in the range $t_3 \leq t \leq t_4$ are:

$$\alpha(t)=-at \tag{4a}$$

$$v(t)=-(at^2/2)+b \tag{4b}$$

$$p(t)=-(at^3/6)+bt \tag{4c}$$

In the zone $t_4 \leq t \leq t_5$, the acceleration α(t), the speed v(t), and the position p(t) are given by:

$$\alpha(t)=at-at_1 \tag{5a}$$

$$v(t)=(at^2/2)-at_1t+v(t_4) \tag{5b}$$

$$p(t)=(at^3/6)-(at_1t^2/2)+v(t_4)t \tag{5c}$$

where $v(t_4)$ represents the speed of the wafer stage at time $t_4$ (in the example of FIG. 2A, a half of the target speed b).

Next, the method of calculating the exposure energy is described. The positional change in the constant speed zone ($t_2 \leq t \leq t_3$) is expressed by the equation (3c). The time course function expressed by the equation (3c) is differentiated to calculate the speed of the wafer stage 12, and the wafer is irradiated with exposure light of the exposure energy adapted to the speed, whereby the exposure energy per unit area can be controlled. That is, the exposure energy E(t) is calculated as follows:

$$dp(t)/dt=b \tag{6a}$$

$$E(t)=b \times L1 \tag{6b}$$

where L1 is the amount of exposure light corresponding to the predetermined pulses of excimer laser, the amount of exposure light being preset to give appropriate amount of light which is determined by the sensitivity of the resist on the wafer when the wafer stage 12 is scanned at the target speed b. The parameter L1 serves as the basis for calculation of the exposure energy.

Next, let us consider the exposure energy in the acceleration zone. The positional change in the range $0 \leq t \leq t_1$ is expressed by the equation (1c). The method of calculating the exposure energy in this range is performed in the above-described manner. That is, the time course function expressed by the equation (1c) is differentiated to calculate the speed function of the wafer stage, and this speed function is multiplied by the amount of exposure light L1. That is, the exposure energy E(t) is calculated as follows:

$$dp(t)/dt=at^2/2 \tag{7a}$$

$$E(t)=(at^2/2) \times L1 \tag{7b}$$

In the range $t_1 \leq t \leq t_2$, the positional change is expressed by the equation (2c). The method of calculating the exposure energy in this range is performed in the above-described manner. That is, the time course function expressed by the equation (2c) is differentiated to calculate the speed function of the wafer stage 12, and this speed function is multiplied by the amount of exposure light L1. That is, the exposure energy E(t) is calculated as follows:

$$dp(t)/dt=-(at^2/2)+at_1t+(at_1^2/2) \tag{8a}$$

$$E(t)=[-(at^2/2)+at_1t+(at_1^2/2)] \times L1 \tag{8b}$$

Let us further consider the exposure energy in the deceleration zone. In the zone from the time, when the constant speed scanning is completed and deceleration starts, until $T_4$, i.e., in the range $t_3 \leq t \leq t_4$, the positional change is expressed by the equation (4c). The method of calculating the exposure energy in this range is performed in the above-described manner. That is, the time course function expressed by the equation (4c) is differentiated to calculate the speed function of the wafer stage 12, and this speed function is multiplied by the amount of exposure light L1. That is, the exposure energy E(t) is calculated as follows:

$$dp(t)/dt=-(at^2/2)+b \tag{9a}$$

$$E(t)=[-(at^2/2)+b] \times L1 \tag{9b}$$

In the range $t_4 \leq t \leq t_5$, the positional change is expressed by the equation (5c). The method of calculating the exposure energy in this range is performed in the above-described manner. That is, the time course function expressed by the equation (5c) is differentiated to calculate the speed function of the-wafer stage 12, and this speed function is multiplied by the amount of exposure light L1. That is, the exposure energy E(t) is calculated as follows:

$$dp(t)/dt=(at^2/2)-at_1t+v(t_4) \tag{10a}$$

$$E(t)=[(at^2/2)-at_1t+v(t_4)] \times L1 \tag{10b}$$

As noted above, the exposure energy is controlled responsive to the speed of the wafer stage 12, whereby exposure with appropriate amount of light becomes possible in the acceleration and deceleration zones as well as in the constant speed zone for the stage, and the entire range where the stage moves can be used for exposure without waste.

Next, the actual control of the exposure energy by the apparatus of the instant embodiment is described. The main control unit 60 receives the speed signal on the wafer stage 12 from the wafer laser interferometer unit 38. Thus, there is no need to calculate the stage speed using the aforementioned time functions. Instead, the speed signal on the wafer stage 12 from the wafer laser interferometer unit 38 is directly used, and multiplied by the amount of exposure light L1, the base, to calculate the target value of the exposure energy during acceleration or deceleration.

Figure 3:
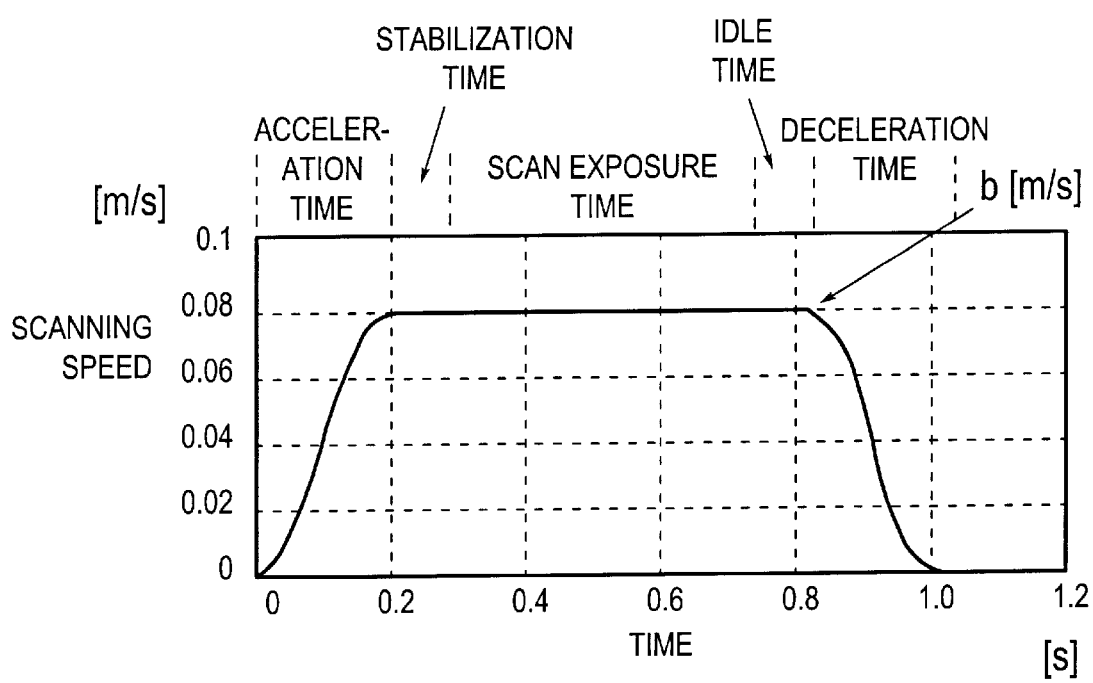
FIG. 3 is a chart showing an example of the time course of the speed of the wafer stage during scan exposure by a conventional apparatus.

According to the scanning projection exposure apparatus 10 of the instant embodiment described above, when the wafer stage 12 and the reticle stage 16 are driven by the stage drive control systems for scan exposure, the target value of the exposure energy is calculated over time by the main control unit 60 on the basis of the speed signal from the wafer laser interferometer unit 38. This target value is passed on to the exposure energy control system 70, where the control amount is determined by the exposure controller 54 so that the exposure energy may coincide with the target value. In response to this control amount, the light source control part 64 controls the number of laser pulses from the light source 46. Thus, not only the constant speed zone, but also the acceleration and deceleration zones of the wafer stage 12 can be used for exposure. Hence, losses of time resulting from acceleration, deceleration and idling (see FIG. 3) can all be excluded, thus shortening the exposure time and improving the throughput. This shortening of the exposure time can be realized without making the speed of the stage high. This can avoid inconveniences, such as cost buildup due to upgrading of a power amplifier and increased vibrations, the problems involved in the speeding of the stage.

Furthermore, the acceleration and deceleration zones can be used for exposure, thus shortening the strokes of the stages, thereby downsizing the stages themselves. This leads to facilitated production, and decreases in the material costs and the processing costs. In addition, the movable parts of the wafer stage can become compact and light-weighted, so that their characteristic vibrational frequencies can be raised. Thus, the control characteristics of the movable parts can be easily improved. Since the response performance of the stages is thus improved, their synchronicity precision can be increased.

In the foregoing embodiment, the speed of the wafer stage has been controlled as in the conventional apparatus such that the stage is accelerated up to the target speed, kept at the target speed, and then decelerated. According to the present invention, however, it becomes possible to perform exposure with appropriate amount of light during acceleration and deceleration. Therefore, a curve such as a sine curve without the constant speed zone can be used to show the target value for speed control.

In the aforementioned embodiment, an excimer laser light source emitting pulsed light has been used as an exposure light source. This is because an excimer laser has excellent frequency response characteristics, and is suitable for high speed control of the amount of exposure light adapted to the speed of the stage. However, an alternative light source, such as a mercury lamp or a continuously oscillating CW laser, may be used as long as it enables continuous control of the amount of exposure light at a sufficient response speed. In the above embodiment, moreover, the amount of exposure light has been controlled by modulating the number of laser pulses. However, the amount of exposure light may be adjusted by modulating the laser power or the intervals of the laser pulses.

In the above embodiment, furthermore, the speed signal on the wafer stage 12 has been entered directly into the main control unit from the wafer laser interferometer unit 38. Alternatively, any of the time functions of the acceleration, the speed, and the position as in the aforementioned equations (1a to 5c) may be stored in the memory over all of the zones of stage drive. By so doing, the speed of the stage can be calculated, and the target value of the exposure energy can be determined from the equations (6a to 10b) based on the calculated speed. In this alternative fashion, the same effect as in the instant embodiment can be obtained.

According to the above embodiment, moreover, the target value of the exposure energy has been obtained in response to the speed of the wafer stage. Needless to say, the target value of the exposure energy may be obtained in response to the speed of the reticle stage. Thus, drive control for the stage may be constructed such that the target value of speed which will cancel the position error between the two stages is produced by the W speed directive part.

In the above embodiment, moreover, the main control unit 60 has obtained the speed signal on the wafer stage 12 from the wafer laser interferometer unit 38. However, it is permissible to enter the position detection signal, which is the output of the wafer laser interferometer 24, directly into the main control unit 60, to convert the position detection signal into a speed signal within the main control unit 60, and calculate the target value of the exposure energy depending on speed on the basis of the speed signal.

As has been described, the present invention performs exposure with appropriate amount of light, regardless of the speed of the substrate stage, throughout the entire time zone from the start of drive in the scan direction of the substrate stage until its standstill. Thus, the exposure time can be shortened without making the stage scanning speed high, and the throughput can be improved. Particularly, the light amount adjustment system is constructed as a closed loop including a light amount detector, and a controller which acts based on an action signal that is the difference between the output of the light amount detector and the target value of the amount of exposure light. Hence, practically no influence is exerted even if any disturbance acts on the light amount adjustment system. Exposure with appropriate amount of light is carried out, regardless of the speed of the substrate stage, throughout the entire time zone from the start of drive in the scan direction of the substrate stage until its standstill. Accordingly, even more accurate control of the amount of exposure light can be made.

What is claimed is:

1. A scanning exposure apparatus comprising:
   a pulse beam light source which emits a pulse beam for exposing a photosensitive substrate with a pattern formed on a mask by illuminating the pattern with the pulse beam;
   a stage which moves the mask and the photosensitive substrate relative to the pulse beam for scanning the mask and the photosensitive substrate with the pulse beam; and
   a controlling system which is electrically connected to the pulse beam light source and controls the pulse beam light source during a period during which the stage is moved in non-constant speed when the mask and the photosensitive substrate are moved for scanning.

2. The scanning exposure apparatus according to claim 1, wherein the controlling system controls the number of pulses of the pulse beam emitted from the light source.

3. The scanning exposure apparatus according to claim 1, wherein the period during which the stage is moved in non-constant speed includes at least one of periods during acceleration and deceleration of the stage.

4. The scanning exposure apparatus according to claim 1, wherein the stage includes a mask stage that moves the mask to scan the mask, and a substrate stage that moves the photosensitive substrate to scan the photosensitive substrate, the mask stage and the substrate stage are moved synchronously while the photosensitive substrate is being exposed, and the controlling system controls the pulse beam light source when at least one of the mask stage and the substrate stage is moved in the non-constant speed.

5. The scanning exposure apparatus according to claim 4, further comprising a projection optical system that projects an image of the pattern of the mask onto the photosensitive substrate, the mask stage moves across an illumination region on the mask for scanning the mask, and the substrate stage moves across an exposure region, which is conjugate to the illumination region with respect to the projection optical system, for scanning the photosensitive substrate.

6. The scanning exposure apparatus according to claim 1, further comprising a measuring device that measures a position of the stage, wherein the controlling system controls the pulse beam light source on the basis of an output from the measuring device.

7. The scanning exposure apparatus according to claim 6, further comprising a converter which converts position information on the stage obtained from the measuring device into speed information, wherein the controlling system controls the pulse beam light source on the basis of an output from the converter.

8. The scanning exposure apparatus according to claim 7, further comprising a calculator which calculates a target value for an amount of exposure light in response to the moving speed of the stage on the basis of an output from the converter, wherein the controlling system controls the pulse beam light source on the basis of the target value of the calculator.

9. The scanning exposure apparatus according to claim 8, wherein the controlling system includes a closed loop control system having a light amount detector that detects an amount of exposure light, and a controller that acts based on a light amount deviation, as an actuating signal, which is a difference between an output of the light amount detector and the target value of the amount of exposure light.

10. The scanning exposure apparatus according to claim 1, wherein the pulse beam includes an excimer laser beam.

11. A scanning exposure apparatus comprising:
a pulse beam light source which emits a pulse beam for exposing a photosensitive substrate with a pattern formed on a mask by illuminating the pattern with the pulse beam;
a stage which moves the mask and the photosensitive substrate relative to the pulse beam for scanning the mask and the photosensitive substrate with the pulse beam; and
a controlling system which is electrically connected to the pulse beam light source and controls the pulse beam light source in response to a moving speed of the stage.

12. The scanning exposure apparatus according to claim 11, wherein the controlling system controls the number of pulses of the pulse beam emitted from the light source.

13. The scanning exposure apparatus according to claim 11, wherein the moving speed includes a constant speed and a non-constant speed.

14. The scanning exposure apparatus according to claim 11, wherein the stage includes a mask stage that moves the mask to scan the mask, and a substrate stage that moves the photosensitive substrate to scan the photosensitive substrate, the mask stage and the substrate stage are moved synchronously while the photosensitive substrate is being exposed, and the controlling system controls the pulse beam light source in response to a moving speed of at least one of the mask stage and the substrate stage.

15. The scanning exposure apparatus according to claim 14, further comprising an optical system that projects an image of the pattern of the mask onto the photosensitive substrate, the mask stage moves across an illumination region on the mask for scanning the mask, and the substrate stage moves across an exposure region, which is conjugate to the illumination region with respect to the optical system, for scanning the photosensitive substrate.

16. The scanning exposure apparatus according to claim 11, further comprising a measuring device that measures a position of the stage, wherein the controlling system controls the pulse beam light source on the basis of an output from the measuring device.

17. The scanning exposure apparatus according to claim 16, further comprising a converter which converts position information on the stage obtained from the measuring device into speed information, wherein the controlling system controls the pulse beam light source on the basis of an output from the converter.

18. The scanning exposure apparatus according to claim 17, further comprising a calculator which calculates a target value for an amount of exposure light in response to the moving speed of the stage on the basis of an output from the converter, wherein the controlling system controls the pulse beam light source on the basis of the target value of the calculator.

19. The scanning exposure apparatus according to claim 18, wherein the controlling system includes a closed loop control system having a light amount detector that detects a light amount of the pulse beam, and a controller that acts based on a light amount deviation, as an actuating signal, which is a difference between an output of the light amount detector and the target value of the light amount.

20. The scanning exposure apparatus according to claim 11, wherein the pulse beam includes an excimer laser beam.

* * * * *